United States Patent [19]
Bisen et al.

[11] Patent Number: 5,900,744
[45] Date of Patent: May 4, 1999

[54] METHOD AND APPARATUS FOR PROVIDING A HIGH SPEED TRISTATE BUFFER

[75] Inventors: Bharat K. Bisen, Santa Clara; Sudarshan Kumar, Fremont, both of Calif.

[73] Assignee: Intel Corporation, Santa Clara, Calif.

[21] Appl. No.: 08/774,431

[22] Filed: Dec. 30, 1996

[51] Int. Cl.$^6$ .......................... H03K 19/02; H03K 19/096
[52] U.S. Cl. .................................. 326/58; 326/57; 326/97
[58] Field of Search .................................. 326/17, 57, 58, 326/83, 95, 96, 98, 97

[56] References Cited

U.S. PATENT DOCUMENTS

| | | | |
|---|---|---|---|
| 5,491,432 | 2/1996 | Wong et al. | 326/98 |
| 5,510,732 | 4/1996 | Sandhu | 326/94 |
| 5,682,110 | 10/1997 | Rountree | 326/58 |

*Primary Examiner*—Michael J. Tokar
*Assistant Examiner*—Daniel D. Chang
*Attorney, Agent, or Firm*—Blakely, Sokoloff, Taylor & Zafman LLP

[57] ABSTRACT

A method and apparatus for providing a high speed tristate buffer. The buffer includes a p-channel pull-up transistor and a transfer gate. The source of the transistor is coupled to a voltage supply. The drain of the transistor is coupled to the buffer output. The gate of the transfer gate is coupled to a first clock source. The input to the transfer gate is a second clock source, and the output of the transfer gate is coupled to the gate of the p-channel transistor.

15 Claims, 4 Drawing Sheets

METHOD AND APPARATUS FOR PROVIDING A HIGH SPEED TRISTATE BUFFER

FIELD OF THE INVENTION

The present invention relates to integrated circuit devices and more particularly to a method and apparatus for reducing the time it takes or a tristate buffer circuit to pull its output line high.

BACKGROUND OF THE INVENTION

Integrated circuit (IC) devices such as, for example, processors, contain numerous circuit blocks known as buffers. A buffer is a circuit that resides on an interconnect line, and may condition or gale the electrical signal that is sent along the interconnect line. For example, an interconnect line may connect a portion of memory in a processor to the processor's execution unit where mathematical operations are carried out. When the signal is initially sent along the interconnect line from memory, the execution unit may be busy executing other data. In this case, a tristate buffer holds the signal on the interconnect line, preventing the signal from passing through to the execution unit. Once the execution unit is ready to receive the signal, the tristate buffer releases the signal, and the data represented by the signal is then allowed to be transferred to the execution unit. The use of a tristate buffer in this manner preserves the accuracy of the data and serves to organize the flow of data through the processor.

As the speed of ICs increases, it becomes more important to implement buffers that are quick to transfer signals from the buffer input to the buffer output. Implementing fast buffers reduces the signal delay associated with passing the signal through the buffer, thereby increasing the speed of the IC.

FIG. 1 is a circuit diagram of a tristate buffer comprising an n-channel and a p-channel transistor in an inverting configuration wherein the gate of the p-channel transistor is controlled by a NAND gate and the gate of the n-channel transistor is controlled by a NOR gate. The input to the buffer is coupled to an input of NAND gate 103 and NOR gate 104. The clock input to the tristate buffer is coupled to an input of NOR gate 104 and an input of inverter 100, the output from inverter 100 being coupled to NAND gate 103. The output of NAND gate 103 is coupled to the gate of p-channel transistor 101, and the output of NOR gate 104 is coupled to the gate of n-channel transistor 102. The source of p-channel transistor 101 is coupled to the voltage supply, and the drain of transistor 101 is coupled to the output of the buffer. The source of n-channel transistor 102 is coupled to ground, and the drain of transistor 102 is coupled to the output of the buffer. Note that in accordance with transistor nomenclature conventions, the source of a p-channel transistor is defined as the transistor node that is coupled to the voltage supply, and the source of a n-channel transistor is defined as the transistor node that is coupled to ground. In typical semiconductor manufacturing processes, however, the source and drain are symmetrical, and therefore the terms "source" and "drain" are commonly interchangeable.

An inverter inverts the value of the signal applied to its input, and provides the inverted signal at its output. For example, when the input to inverter 100 of FIG. 1 is low (e.g. ground or a predefined logical low value, typically associated with a logical "0" but may be a logical "1" in an inverted logic configuration) the output from inverter 100 is high (e.g. the voltage supply value or a predefined logical high value, typically associated with a logical "1" but may be a logical "0" in an inverted logic configuration). A NAND gate applies a NAND function to its inputs to generate an output, and a NOR gate applies a NOR function to its inputs to generate an output.

When the input to the tristate buffer circuit of FIG. 1 is low, and the clock is low, the output of NAND gate 103 is high and the output of NOR gate 104 is high, thereby turning p-channel transistor 101 off and turning n-channel transistor 102 on. When n-channel transistor 102 is turned on, its drain and source begin to conduct, thereby draining charge from the output line, through transistor 102, to ground, also known as pulling the output down to ground. For this reason, an n-channel transistor in the inverting configuration of FIG. 1 is referred to as a pull-down transistor.

If, instead, the input to the tristate buffer circuit of FIG. 1 is high while the clock is low, the low output of NAND gate 103 turns on p-channel transistor 101, and the low output of NOR gate 104 turns off n-channel transistor 102. When p-channel transistor 101 is turned on, its drain and source begin to conduct, thereby driving charge from the voltage supply onto the output line, through transistor 101, also known as pulling the output up to the voltage supply voltage level. For this reason, a p-channel transistor in the inverting configuration of FIG. 1 is referred to as a pull-up transistor.

Although the input to the tristate buffer of FIG. 1 will be the same value as the output of the buffer during steady state operation, there is some propagation delay associated with pulling the output up or down after the input value switches. Because n-channel transistors in the conduction state (the "on" state) have much lower source-to-drain resistance than p-channel transistors in the conduction state, the output of the buffer or inverter is pulled down much more quickly than it is pulled up. To reduce the pull-up time, a p-channel pull-up transistor is typically made wider than its corresponding n-channel pull-down transistor, thereby reducing the resistance of the p-channel device. Unfortunately, there is an upper limit imposed upon the width of the p-channel transistor because as the p-channel transistor is widened, its gate/source and gate/drain capacitance increases, which has the effect of slowing the switching speed of the p-channel transistor. Eventually, this slower switching speed will dominate and counteract the speed advantages gained by increasing the p-channel device size.

Increasing the p-channel transistor size also uses up valuable semiconductor surface area on the integrated circuit device, thereby increasing manufacturing costs and increasing the size of the IC. In addition, if the resistance on the output line is large enough (e.g. the output line is long), reducing the p-channel transistor resistance by increasing the width will not have a significant impact on reducing the pull-up time because the overall resistance will not be significantly reduced.

SUMMARY OF THE INVENTION

A method and apparatus is described for providing a high speed tristate buffer. The buffer includes a p-channel pull-up transistor and a transfer gate. The source of the transistor is coupled to a voltage supply. The drain of the transistor is coupled to the buffer output. The gate of the transfer gate is coupled to a first clock source. The input to the transfer gate is a second clock source, and the output of the transfer gate is coupled to the gate of the p-channel transistor.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
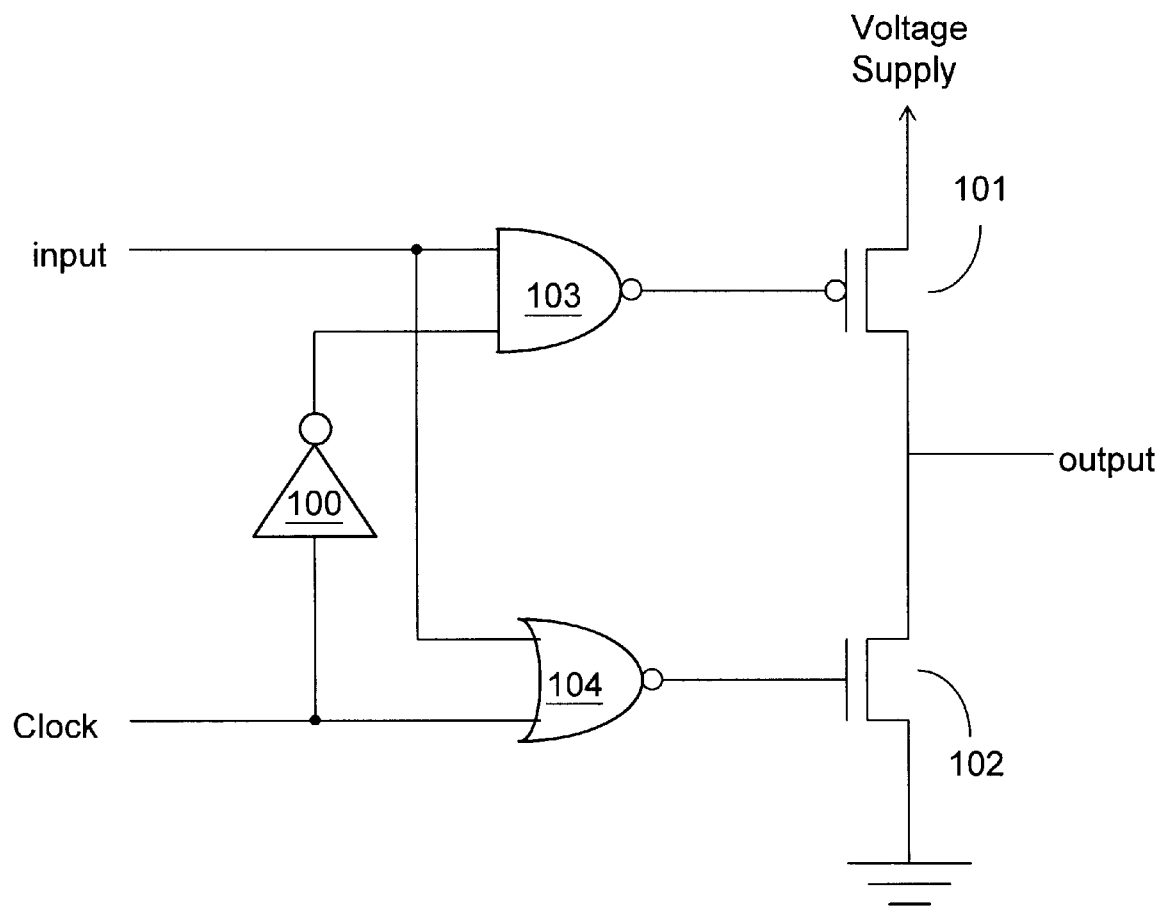
FIG. 1 is a circuit diagram of a prior art tristate buffer circuit.

A tristate buffer is described that provides a fast pull-up time. The buffer has two stages. The first stage is an inverter, and the second stage is another inverter that is gated by a clock signal. The two inverter stages are coupled in series. When an input signal is provided to the input of the buffer, the first inverter inverts this signal to an intermediate signal. The intermediate signal is then split into an upper signal and a lower signal. Each of the upper and lower signals is provided to the input of a transfer gate, and the gates of the two transfer gates are both controlled by a first clock signal. The output of the upper transfer gate is coupled to the gate of a p-channel pull-up transistor of the second inverter, and the output of the lower transfer gate is coupled to the gate of an n-channel pull-down transistor of the second inverter.

A second clock signal that is synchronized to the first clock signal, but slightly earlier than the first clock signal, is provided to the gate of the p-channel pull-up transistor through a third transfer gate, the gate of which is controlled by the first clock signal. When the first clock signal goes high, the upper and lower transfer gates are turned off (closed), the third transfer gate is turned on (opens), and the second clock signal, which is also high, is applied to the gate of the p-channel transistor, turning it off. When the second clock signal goes low, it pulls the gate of the p-channel transistor down. This will begin turning on the p-channel transistor and therefore start charging the output towards a high state (assuming the output is not already clamped to a particular voltage level by, e.g., a sustainer circuit). Then, the first clock signal goes low soon afterwards, closing the third transfer gate and opening the upper and lower transfer gates, allowing the inverted input signal to the buffer to pass through to the gates of the p-channel and n-channel transistors.

If the input signal to the buffer is high, a low signal is applied to the gate of the p-channel transistor, draining the remaining charge and pulling the gate of the transistor further down. Thus the p-channel pull-up transistor is turned on, thereby pulling the output line high. Because the gate of the p-channel transistor is drained of at least a portion of charge before the low intermediate signal is applied, the intermediate signal need only pull the gate down from a pre-drained intermediate voltage rather than all the way down from a fully charged voltage level. As a result, the gate is pulled down earlier in accordance with this embodiment of the present invention, and so the output line is, in turn, pulled up much faster.

The tristate buffer circuit and its method of operation are described in more detail below to provide a more thorough description of how to implement an embodiment of the present invention. Various other configurations and implementations in accordance with alternate embodiments of the present invention are also described in more detail below.

Figure 2:
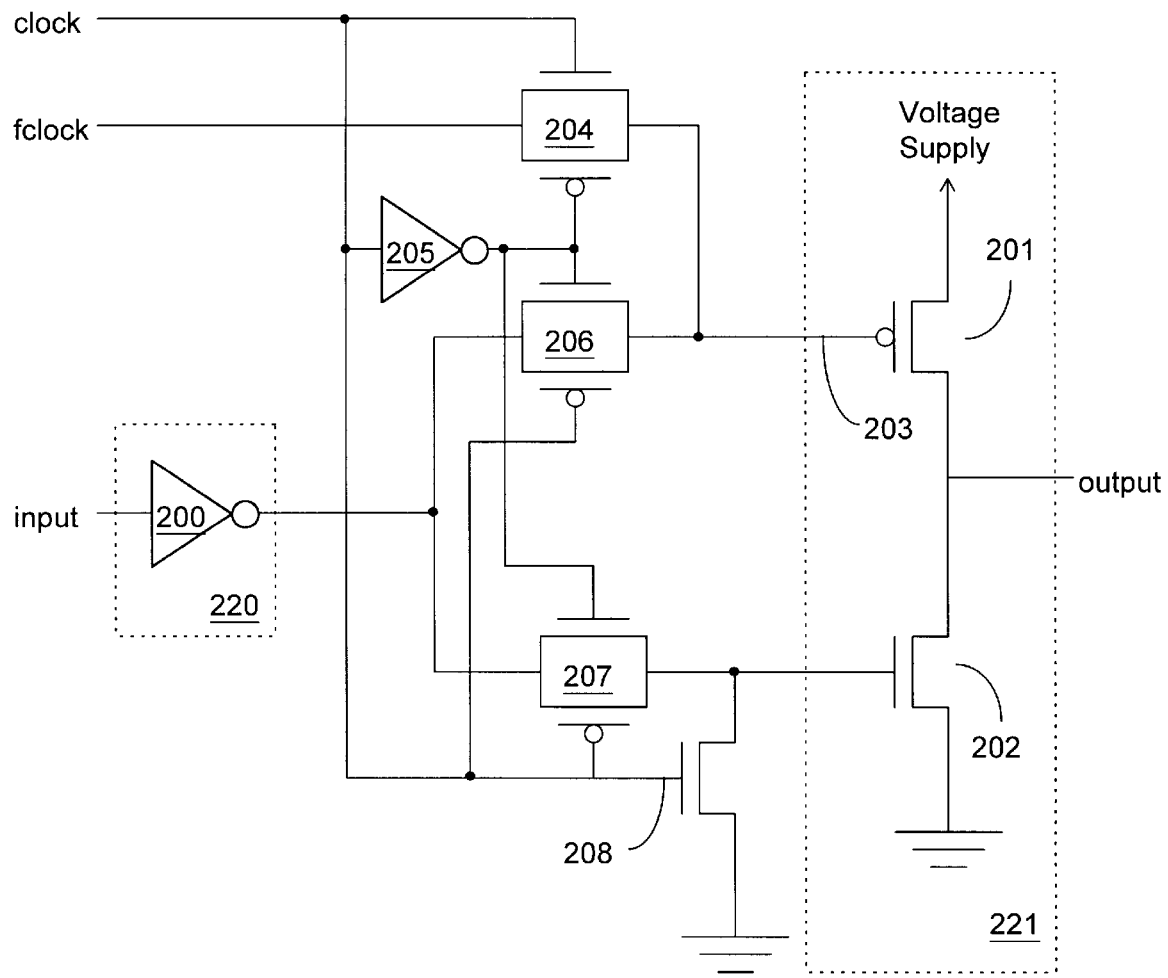
FIG. 2 is a circuit diagram of one embodiment of a tristate buffer circuit of the present invention.

FIG. 2 is a circuit diagram of a buffer circuit formed in accordance with an embodiment of the present invention. The buffer circuit includes two inverter stages coupled in series, a first stage 220 comprising inverter 200, and a second stage 221 comprising the inverter formed by p-channel transistor 201 and n-channel transistor 202. The second stage is gated by transfer gates 206 and 207, and transfer gate 204 is included to gate the fclock signal that serves to predrain charge from the gate node 203 of p-channel transistor 201 before the inverted input is applied to node 203 through transfer gate 206.

As shown in FIG. 2, the input line to the buffer circuit is coupled to the input of inverter 200, the output of which is coupled to the input of each of upper transfer gate 206 and lower transfer gate 207 in parallel. The gates of transfer gates 206 and 207 are controlled by the clock signal, provided directly to the p-channel transistor gates and through inverter 205 to the n-channel transistor gates of the transfer gates, such that transfer gates 206 and 207 are open when the clock signal is low and the transfer gates are closed when the clock signal is high. The output of transfer gates 206 and 207 is coupled to the gate node 203 of p-channel pull-up transistor 201 and the gate of n-channel pull-down transistor 202, respectively. The source of p-channel transistor 201 is coupled to the voltage supply, and the source of n-channel transistor 202 is coupled to ground. The drains of both transistors 201 and 202 are coupled to the output line.

Note that in accordance with the nomenclature used herein, a signal is either ground or some other voltage level, and a signal line is the interconnect line that carries the signal. For example, the clock signal is provided along the clock signal line to the n-channel transistor of transfer gate 204. The p-channel transistor 201 drives the output signal onto the output signal line (or, simply, output line) when the transistor is turned on.

A second clock signal, fclock, is also provided. Fclock is synchronized to the clock signal, but is slightly earlier than the clock signal. For one embodiment of the present invention, fclock is provided by a clock source, and the clock signal is created by routing the fclock signal through a delay circuit comprising two inverters coupled in series followed by a NAND gate to create a one way delay. For another embodiment, the clock signal is created by routing the fclock signal through a delay circuit comprising two, four, or any other even number of inverters coupled in series. In accordance with an embodiment of the present invention, the clock source is a clock multiplier that, when provided with a system clock signal at its input, provides some multiple of that system clock signal at its output.

Referring again to FIG. 2, the input to transfer gate 204 is coupled to the fclock signal line, and the output of transfer gate 204 is coupled to node 203 which is the gate of p-channel pull-up transistor 201. The gate of transfer gate 204 is controlled by the clock signal, directly to the n-channel transistor and via inverter 205 to the p-channel transistor of the transfer gate, such that the transfer gate is open when the clock signal is high, and closed when the clock signal is low. The drain of n-channel transistor 208 is coupled to the gate of transistor 202. The gate of transistor 208 is coupled to the clock signal line, and the source of transistor 208 is coupled to ground.

Figure 3:
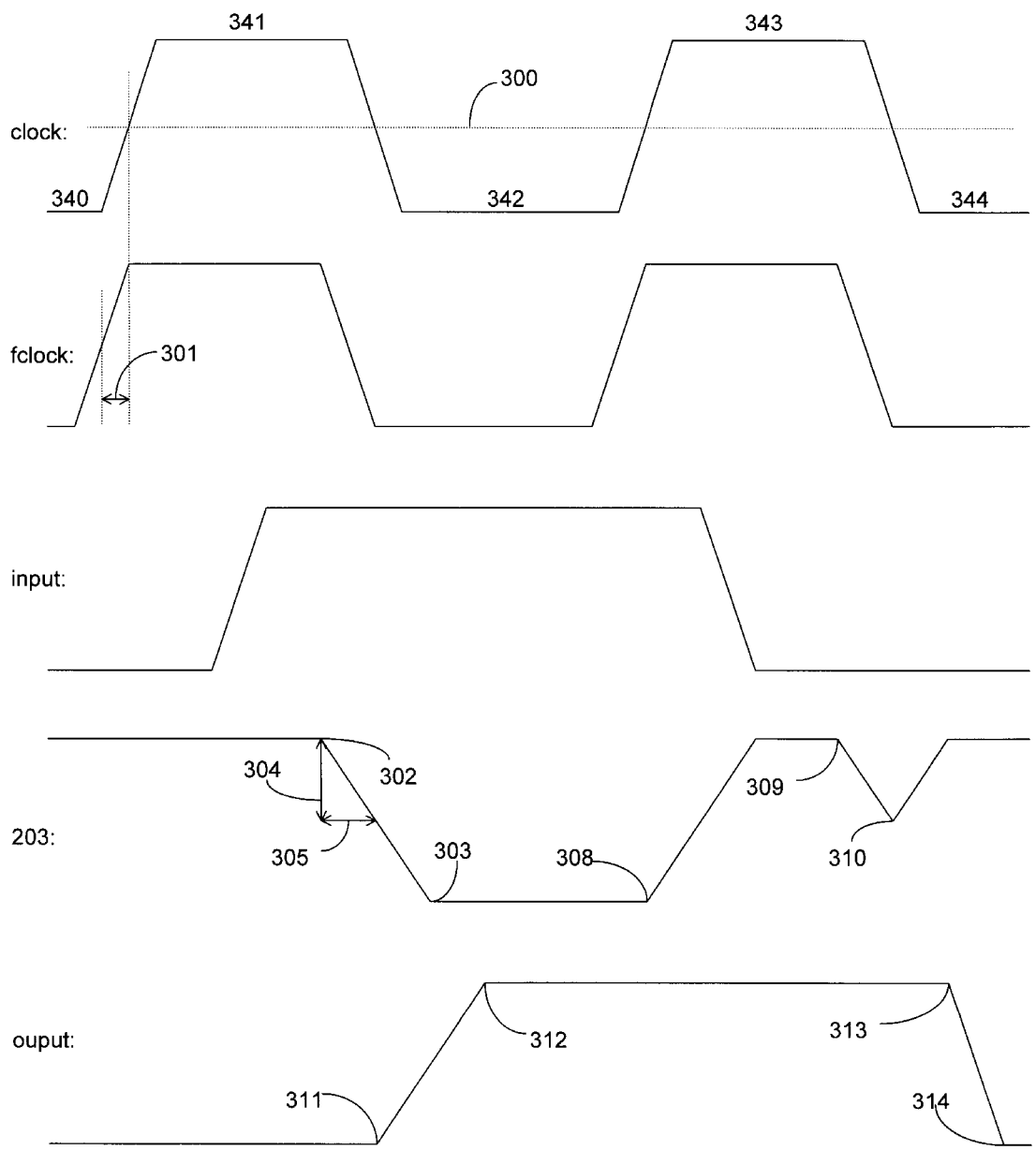
FIG. 3 is a timing diagram corresponding to the operation of the m buffer circuit of FIG. 2.

FIG. 3 is a timing diagram corresponding to the operation of the buffer circuit of FIG. 2. Note how the clock and fclock signals are synchronized, but that the clock signal lags the fcock signal by a delay shown by 301 (as measured mid-way between the low and high voltage levels). This delay is approximately 0.3 ns, but may be in the range of approximately 0.1 ns to 0.5 ns. For one embodiment of the present invention, the time margin between the two clock signals is adjusted beyond this range to provide the desired performance. For the purpose of this discussion, threshold line 300 is presumed to correspond to the voltage at which the transfer gates controlled by the clock signal are toggled (opened or closed).

Initially, as shown in FIG. 3, the clock signal is low during period of time 340, as is the fclock signal, the input signal, and the output signal. The gate signal on gate 203 of the p-channel pull-up transistor is high. The fclock signal begins to go high soon before the clock signal goes high. After both the clock and fclock signals are high during period of time 341, the input signal goes high.

At this point, transfer gate 204 is open while transfer gates 206 and 207 are closed. The input to inverter 200 is high, so its output to the inputs of upper and lower transfer gates 206 and 207 is low. Transistor 208 is turned on due to the high voltage applied by the clock signal to the gate of the transistor, thereby pulling the voltage level on the gate of n-channel pull-down transistor 208 down to ground, turning transistor 202 off. The purpose of transistor 208 is to keep the gate voltage of transistor 202 from floating. Because transfer gate 204 is open, the high fclock signal is applied to the gate of transistor 201, at node 203, turning this p-channel transistor off.

According to FIG. 3, as the fclock signal begins to fall, the voltage on node 203 begins to fall as well because, initially, transfer gate 204 is open, allowing the fclock signal to be applied directly to node 203. This continues until the clock signal then falls past threshold line 300. The point at which the clock signal falls past threshold line 300 corresponds to point 303 of the node 203 signal. As the clock and fclock signals fall, the charge on node 203 similarly begins to fall from the peak value indicated at point 302 to point 303. This corresponds to a drain of charge from node 203 of a quantity 304 over the course of time 305. Once the gate voltage at node 203 reaches point 303, the clock signal crosses threshold line 300 and transfer gate 204 closes while transfer gates 206 and 207 open.

Once transfer gates 206 and 207 are open, the low output from inverter 200 is applied to the gates of transistors 201 and 202. As a result, node 203 is pulled the rest of the way down to ground from point 303, and as the gate of p-channel transistor 201 is pulled down, the transistor is turned on and pulls the output line up from point 311, or somewhere between 311 and 312, to point 312. Because at least a portion of the charge at node 203 is predrained by the falling fclock signal, the p-channel device is turned on sooner than would otherwise be expected if one had to wait until the clock signal crossed threshold line 300 before beginning to pull node 203 down. Although in accordance with one embodiment of the present invention the slope of the pull-up of the output signal, from point 311 to point 312, is still approximately the same, because the pull-up begins approximately a time 305 sooner, the high output value at point 312 is ultimately reached sooner. This has the effect of reducing the delay time of the tristate buffer circuit.

Referring to FIG. 3, the input signal remains high during period of time 342. Next, both the fclock and clock signals increase to 343. During the second half of the increase in voltage of the clock signal, after threshold line 300 is crossed, the gate voltage 203 again increases from point 308 due to the fact that transfer gates 206 and 207 are closed and transfer gate 204 is open. This allows the fclock signal to be applied to node 203 through the transfer gate, thereby pulling node 203 up.

The input signal falls to its initial value while the clock signal remains high during period of time 343. This causes the output of inverter 200 to go high, but because transfer gates 206 and 207 are closed, this high voltage signal level cannot be applied to the gates of transistors 203 and 202. Transistor 208 is turned on by the clock signal, pulling down the gate voltage of transistor 202, keeping it off. The high fclock signal is applied to the gate of p-channel transistor 201 at node 203, turning it off as well. At this point, before the clock and fclock signals transition back down, the output is held high by a sustainer circuit (not shown) coupled elsewhere along the output line. For one embodiment of the present invention, the sustainer circuit comprises a first inverter, the input to which is coupled to the output line, the output from which is coupled to the input of a second inverter, the output from which is also coupled to the output line.

In accordance with the embodiment shown in FIG. 3, when the fclock signal begins to fall again, it is applied directly to node 203 through open pass gate 204, pulling down the gate voltage from point 309 to point 310 by draining charge off the gate. However, point 310 corresponds to the point at which the clock signal crosses threshold line 300 and transfer gate 204 closes while the other transfer gates open. Once transfer gates 206 and 207 are open at point 310, the high signal coming from the output of inverter 200 pulls the gate voltage at node 203 back up. This has the effect of turning off p-channel transistor 201 while the high voltage applied to the gate of n-channel transistor 202 turns on the n-channel transistor. As a result, n-channel pull-down transistor 202 pulls down the output line from point 313 to point 314.

Because an n-channel transistor can pull-down an output line voltage much faster than a similarly sized p-channel transistor can pull it up, the slope between points 313 and 314 is much steeper than the slope between points 311 and 312. For an alternate embodiment of the present invention, the size of the n-channel transistor is increased to more quickly pull-down the output line, possibly shifting the transition between points 313 and 314 towards the left (earlier in time).

Figure 4:
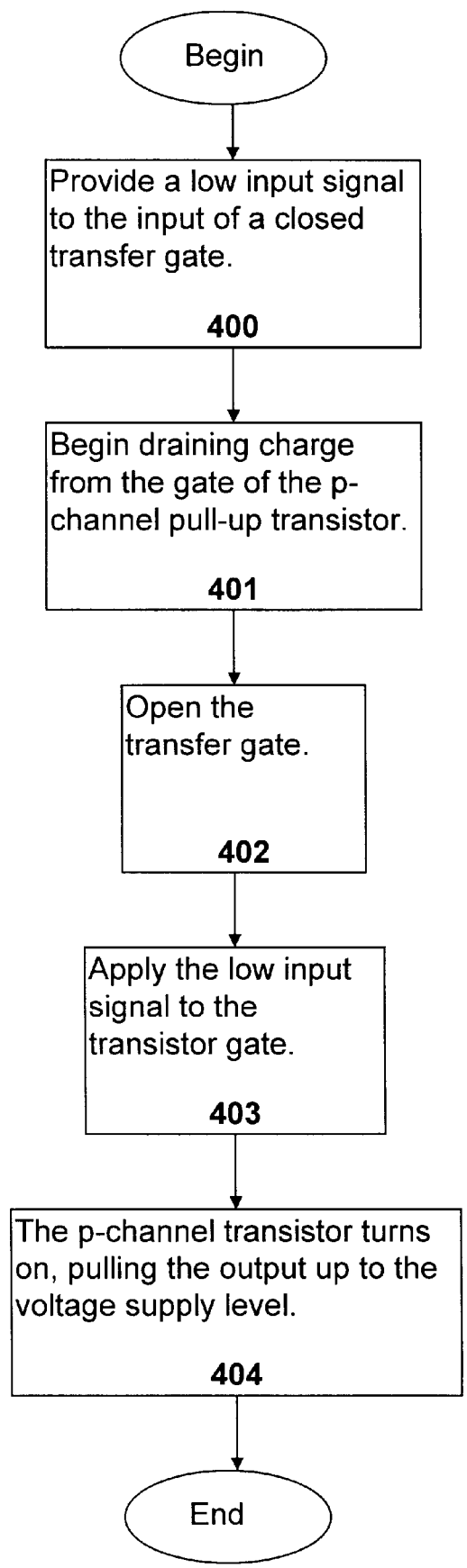
FIG. 4 is a flow chart of a method of one embodiment of the present invention.

FIG. 4 is a flow chart of a method of one embodiment of the present invention. At step 400, a low input signal is provided to the input of a closed transfer gate. For one embodiment of the present invention, this low input signal is the output of a first inverter in a buffer circuit. Also, in accordance with the embodiment of the present invention shown in the flow chart of FIG. 4, the voltage on the gate of the p-channel pull-up transistor is initially high.

Next, at step 401 of FIG. 4, some portion of the charge on the gate of the p-channel pull-up transistor is drained. For one embodiment of the present invention, the p-channel pull-up transistor is coupled to an n-channel pull-down transistor in an inverting configuration within a tristate buffer circuit. In accordance with one embodiment of the present invention, charge is drained from the gate of the p-channel transistor, thereby pulling the gate down, by a gated clock signal. For one embodiment, approximately half the charge is drained from the gate of the p-channel transistor. For example, for an embodiment in which the voltage supply is 2 volts, the gate of the p-channel transistor is drained to approximately 1 volt.

Next, at step 402 of FIG. 4, the transfer gate is opened so that, at step 403, the low input signal is applied to the transistor gate, thereby pulling the transistor gate the remainder of the way down to ground or the low voltage value. At step 404 the p-channel pull-up transistor is fully turned on, pulling the output line up to the voltage supply level. In this manner, the turning on of the p-channel transistor gets a head start by pulling its gate voltage down (pre-draining the gate voltage) before the input signal is actually applied to the gate.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A circuit, comprising:

a p-channel transistor having a source coupled to a voltage supply line, a drain coupled to an output line, and a gate;

a first transfer gate having a gate coupled to a first clock signal line, an input coupled to a second clock signal line, and an output coupled to the gate of the p-channel transistor; and a delay circuit having an input coupled to the second clock signal line and an output coupled to the first clock signal line.

2. The circuit of claim 1, further comprising a second transfer gate having a gate coupled to the first clock signal line, an input coupled to an intermediate signal line, and an output coupled to the gate of the p-channel transistor.

3. The circuit of claim 1, further comprising a n-channel transistor having a source coupled to a ground line, a drain coupled to the output line, and a gate.

4. The circuit of claim 3, further comprising:

a second transfer gate having a gate coupled to the first clock signal line, an input coupled to an intermediate signal line, and an output coupled to the gate of the p-channel transistor; and a third transfer gate having a gate coupled to the first clock signal line, an input coupled to the intermediate signal line, and an output coupled to the gate of the n-channel transistor.

5. The circuit of claim 4, further comprising an inverter having an input coupled to an input line, and an output coupled to the intermediate signal line.

6. The circuit of claim 1, wherein the delay circuit is two inverters coupled in series.

7. The circuit of claim 1, wherein the delay circuit causes a first clock signal to be delayed by a period of time in the range of approximately 0.1 ns to 0.5 ns.

8. A processor, comprising:

a p-channel transistor having a source coupled to a voltage supply line, a drain coupled to an output line, and a gate;

an n-channel transistor having a source coupled to a ground line, a drain coupled to the output line, and a gate; and a first transfer gate having a gate coupled to a first clock source, an input coupled to a second clock source, and an output coupled to the gate of the p-channel transistor, the first clock source being the second clock source routed through a delay circuit.

9. The processor of claim 8, further comprising a second transfer gate having a gate coupled to the first clock source, an input coupled to an intermediate signal line, and an output coupled to the gate of the p-channel transistor.

10. The processor of claim 8, further comprising:

a second transfer gate having a gate coupled to the first clock source, an input coupled to an intermediate signal line, and an output coupled to the gate of the p-channel transistor; and a third transfer gate having a gate coupled to the first clock source, an input coupled to the intermediate signal line, and an output coupled to the gate of the n-channel transistor.

11. The processor of claim 10, wherein the p-channel transistor, the n-channel transistor, and the first, second, and third transfer gates are part of a tristate buffer circuit.

12. The circuit of claim 8, wherein the delay circuit is two inverters coupled in series.

13. The circuit of claim 8, wherein the second clock source is a clock multiplier configured to be coupled to a system clock.

14. A method for inverting a low input signal to a high output signal, comprising the steps of:

a. providing the low input signal to a first input of a first transfer gate, the first transfer gate being closed;

b. draining at least a portion of charge from a gate of a p-channel pull-up transistor for a predetermined period of time by applying a first clock signal to the gate of the p-channel transistor, the p-channel transistor having a source coupled to a voltage supply, a drain coupled to an output line, and the gate coupled to an output of the first transfer gate;

c. opening the first transfer gate in response to a second clock signal, the second clock signal being delayed with respect to the first clock signal;

d. applying the low input signal to the gate of the p-channel transistor, turning on the p-channel transistor; and e. pulling the output line high.

15. The circuit of claim 14, wherein the first clock signal is applied to the gate of the p-channel transistor through a second transfer gate that is controlled by the second clock signal.

* * * * *

UNITED STATES PATENT AND TRADEMARK OFFICE
CERTIFICATE OF CORRECTION

PATENT NO. : 5,900,744
DATED : May 4, 1999
INVENTOR(S) : Bisen et al.

It is certified that error appears in the above-identified patent and that said Letters Patent is hereby corrected as shown below:

Column 1,
Line 15, delete "gale" and insert -- gate --.
Line 12, delete "m".

Column 5,
Line 1, delete "fcock" and insert -- fclock --.
Line 52, delete "felock" and insert -- fclock --.

Signed and Sealed this

Second Day of December, 2003

JAMES E. ROGAN
*Director of the United States Patent and Trademark Office*